(12) United States Patent
Ohno et al.

(10) Patent No.: US 12,033,927 B2
(45) Date of Patent: Jul. 9, 2024

(54) METHOD FOR MANUFACTURING WIRING SUBSTRATE

(71) Applicant: IBIDEN CO., LTD., Gifu (JP)

(72) Inventors: Isao Ohno, Ogaki (JP); Tomoya Daizo, Ogaki (JP); Yoji Sawada, Ogaki (JP); Kazuhiko Kuranobu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 572 days.

(21) Appl. No.: 17/361,522

(22) Filed: Jun. 29, 2021

(65) Prior Publication Data

US 2022/0013409 A1 Jan. 13, 2022

(30) Foreign Application Priority Data

Jul. 9, 2020 (JP) ................................ 2020-118814

(51) Int. Cl.
*H01L 21/48* (2006.01)
*H01L 23/498* (2006.01)

(52) U.S. Cl.
CPC .... *H01L 23/49822* (2013.01); *H01L 21/4857* (2013.01)

(58) Field of Classification Search
CPC .................................................. H01L 21/4857
See application file for complete search history.

(56) References Cited

U.S. PATENT DOCUMENTS

2015/0092357 A1* 4/2015 Yoshikawa ............ H05K 1/113
216/13
2016/0014898 A1* 1/2016 Adachi ............. H01L 23/49894
361/767

FOREIGN PATENT DOCUMENTS

JP 2010-129996 A 6/2010

* cited by examiner

*Primary Examiner* — Daniel Luke
(74) *Attorney, Agent, or Firm* — Oblon, McClelland, Maier & Neustadt, L.L.P.

(57) ABSTRACT

A method for manufacturing a wiring substrate includes forming multiple conductor pads on an insulating layer such that the conductor pads include multiple first conductor pads and multiple second conductor pads, forming multiple protruding parts on surfaces of the first conductor pads of the conductor pads, respectively, forming a resin layer such that the resin layer covers the insulating layer and the conductor pads, exposing, from the resin layer, end portions of the protruding parts on the opposite side with respect to the insulating layer, forming, in the resin layer, multiple openings such that the openings expose surfaces of the second conductor pads of the conductor pads, respectively; and forming a coating film on the surfaces of the second conductor pads exposed in the openings.

20 Claims, 7 Drawing Sheets

METHOD FOR MANUFACTURING WIRING SUBSTRATE

CROSS-REFERENCE TO RELATED APPLICATIONS

The present application is based upon and claims the benefit of priority to Japanese Patent Application No. 2020-118814, filed Jul. 9, 2020, the entire contents of which are incorporated herein by reference.

BACKGROUND OF THE INVENTION

Field of the Invention

The present invention relates to a method for manufacturing a wiring substrate.

Description of Background Art

Japanese Patent Application Laid-Open Publication No. 2010-129996 describes a method for manufacturing a substrate having metal posts. In this method, a solder resist layer is formed on a base substrate having connection pads, and opening parts exposing the connection pads are formed in the solder resist layer. After that, a seed layer is formed in the opening parts and on the surface of the solder resist layer, and the metal posts are formed on the connection pads in the opening parts by a plating process. The entire contents of this publication are incorporated herein by reference.

SUMMARY OF THE INVENTION

According to one aspect of the present invention, a method for manufacturing a wiring substrate includes forming multiple conductor pads on an insulating layer such that the conductor pads include multiple first conductor pads and multiple second conductor pads, forming multiple protruding parts on surfaces of the first conductor pads of the conductor pads, respectively, forming a resin layer such that the resin layer covers the insulating layer and the conductor pads, exposing, from the resin layer, end portions of the protruding parts on the opposite side with respect to the insulating layer, forming, in the resin layer, multiple openings such that the openings expose surfaces of the second conductor pads of the conductor pads, respectively; and forming a coating film on the surfaces of the second conductor pads exposed in the openings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
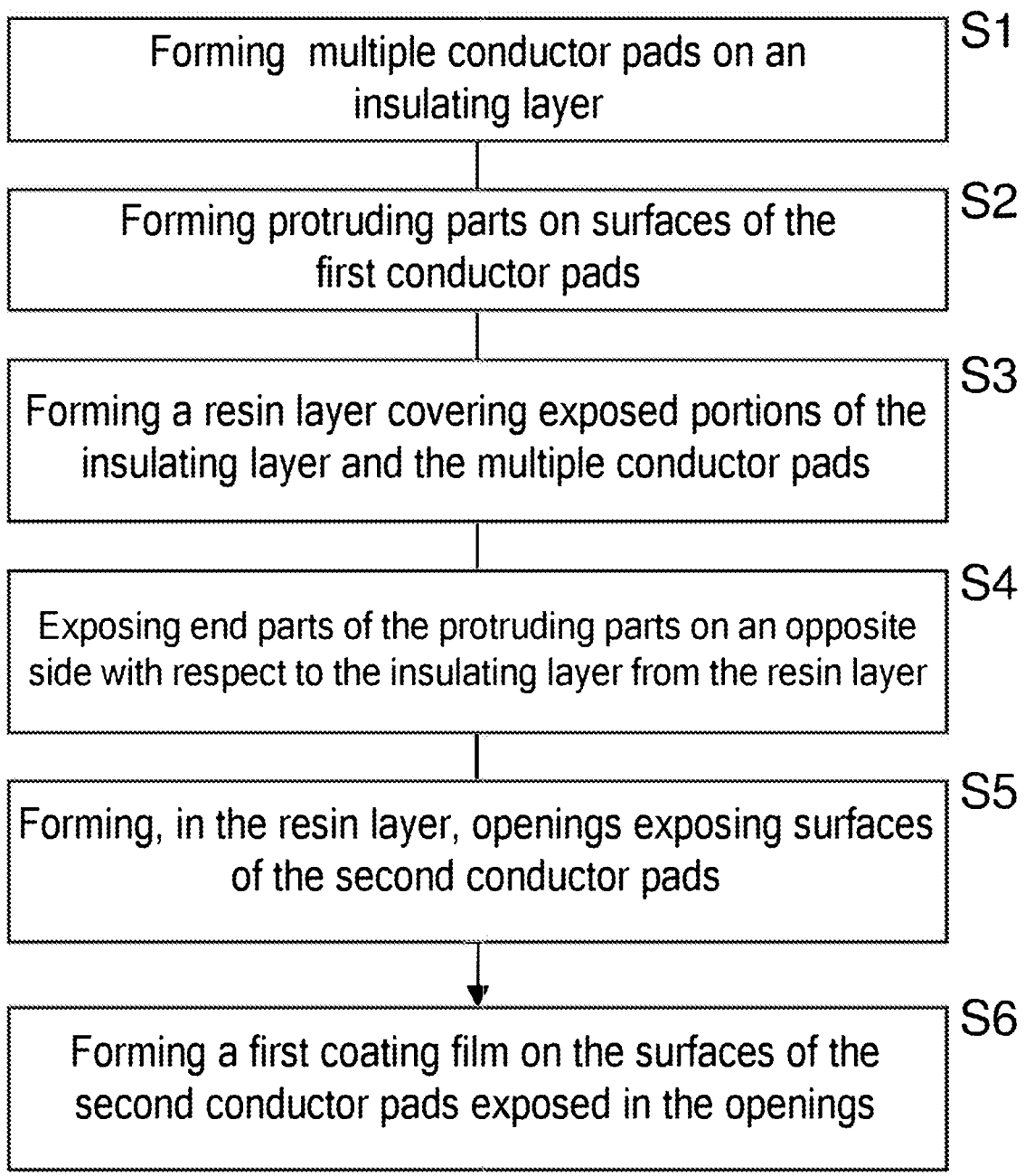
FIG. 1 is a flowchart illustrating an example of a method for manufacturing a wiring substrate according to an embodiment of the present invention.

Embodiments will now be described with reference to the accompanying drawings, wherein like reference numerals designate corresponding or identical elements throughout the various drawings.

Figure 2:
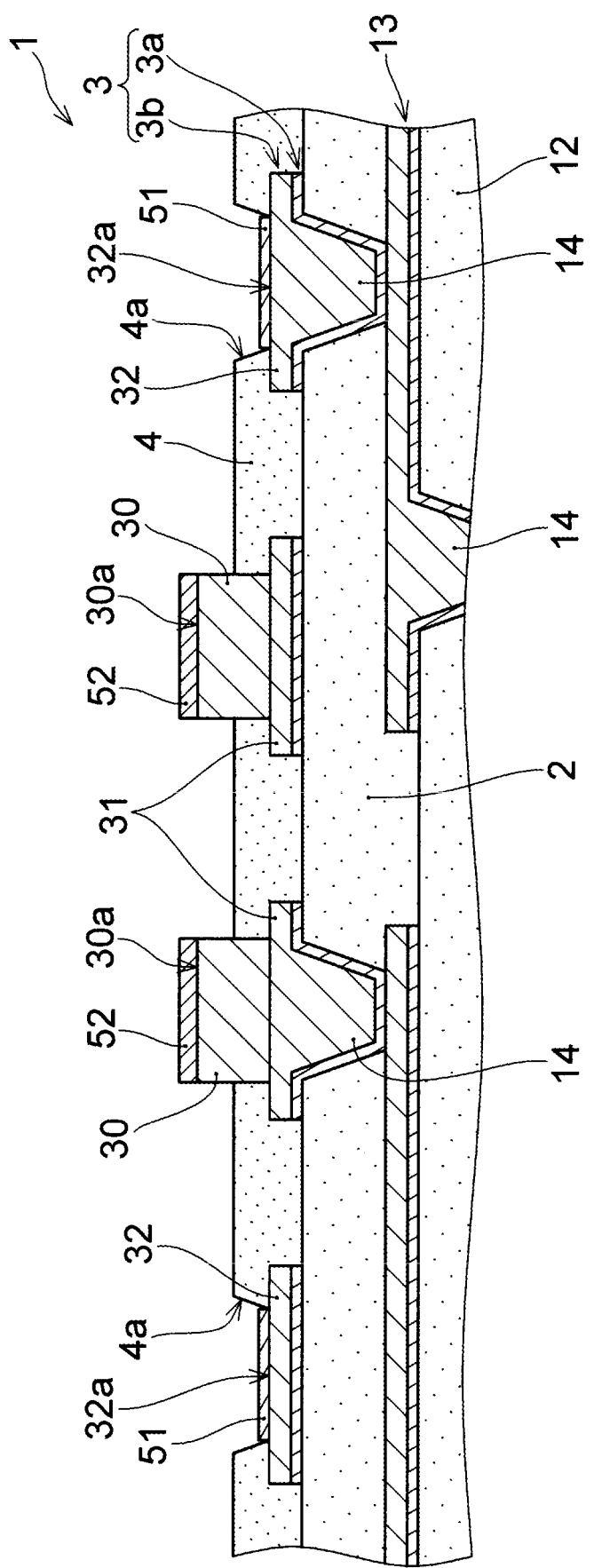
FIG. 2 is a cross-sectional view partially illustrating an example of a wiring substrate manufactured using a method for manufacturing a wiring substrate according to an embodiment of the present invention.

A method for manufacturing a wiring substrate of an embodiment of the present invention is described with reference to the drawings. FIG. 1 is a flowchart illustrating an example of the method for manufacturing the wiring substrate of the embodiment. FIG. 2 illustrates a partial cross-sectional view of a wiring substrate 1 manufactured using the method for manufacturing the wiring substrate of the embodiment.

As illustrated in FIGS. 1 and 2, the method for manufacturing the wiring substrate of the embodiment includes: forming multiple conductor pads including first conductor pads 31 and second conductor pads 32 on an insulating layer 2 (Process S1); and forming protruding parts 30 on surfaces of the first conductor pads 31 on an opposite side with respect to the insulating layer 2 (Process S2). The method for manufacturing the wiring substrate of the embodiment further includes: forming a resin layer 4 covering exposed portions of the insulating layer 2 and the multiple conductor pads (the first conductor pads 31 and the second conductor pads 32) (Process S3); and exposing end parts of the protruding parts 30 on an opposite side with respect to the insulating layer 2 from the resin layer 4 (Process S4). The method for manufacturing the wiring substrate of the embodiment further includes: forming openings (4a) that expose surfaces (32a) of the second conductor pads 32 in the resin layer 4 (Process S5); and forming a first coating film 51 on the surfaces (32a) of the second conductor pads 32 exposed in the openings (4a) (Process S6).

Processes S1-S6 do not have to be performed in the order downward from above (S1→S2→S3→S4→S5→S6) illustrated FIG. 1. Two or more processes that can be performed simultaneously with each other or in an order opposite to the order illustrated in FIG. 1 may be performed simultaneously or in an order opposite to that of FIG. 1. However, as described below, the first coating film 51 is formed after the resin layer 4 is formed.

In the method for manufacturing the wiring substrate of the present embodiment, the first coating film 51 is formed on the surfaces (32a) of the second conductor pads 32 exposed from the resin layer 4 by the formation of the openings (4a). That is, the first coating film 51 is formed after the resin layer 4 is formed. Since the exposed portions of the multiple conductor pads including the first conductor pads 31 are covered by the resin layer 4, the first coating film 51 is formed only on the surfaces (32a) of the second conductor pads 32 exposed from the resin layer 4. Therefore, the first coating film 51 is not formed on the first conductor pads 31. In a case where the formation of the protruding parts 30 on the surfaces of the first conductor pads 31 is performed before the formation of the resin layer 4, formation regions of the protruding parts 30 on the first conductor pads 31 are not covered by the resin layer 4, but are covered by the protruding parts 30. Therefore, the first coating film 51 is not formed between a protruding part 30 and a part other than the protruding part 30 of a first conductor pad 31. In the following description, a "part other than a protruding part 30" of a first conductor pad 31 after the protruding part 30 is formed is also referred to as a "main body part".

The insulating layer 2 illustrated in FIG. 2 is laminated on an insulating layer 12 and a conductor layer 13. A conductor layer 3 including the first conductor pads 31 and the second conductor pads 32 is formed on a surface of the insulating layer 2 on an on an opposite side with respect to the insulating layer 12. The insulating layer 2, the insulating layer 12, the conductor layer 3, and the conductor layer 13 form a part of the wiring substrate 1, which is a multilayer wiring substrate. Via conductors 14 connecting the conductor layer 3 and the conductor layer 13 to each other are formed in the insulating layer 2. Via conductors 14 connecting the conductor layer 13 to a conductor layer (not illustrated in the drawings) opposing the conductor layer 13 across the insulating layer 12 are formed in the insulating layer 12. The wiring substrate 1 may further include any number of conductor layers and any number of insulating layers on the insulating layer 12 on an opposite side with respect to the insulating layer 2. A wiring substrate manufactured using the method for manufacturing the wiring substrate of the present embodiment is not limited to the example of FIG. 2, and may be a double-sided wiring substrate including only the insulating layer 2 as an insulating layer, or a single-sided wiring substrate including only the conductor layer 3 as a conductor layer.

The insulating layer 2 and the insulating layer 12 are each formed of any insulating resin. Examples of the insulating resin include an epoxy resin, a bismaleimide triazine resin (BT resin), a phenol resin, and the like. The insulating layers may each contain a core material (reinforcing material) formed of a glass fiber or an aramid fiber. The insulating layers may further each contain inorganic filler formed of fine particles of silica ($SiO_2$), alumina, mullite, or the like.

The conductor layer 3 (including the first conductor pads 31 and the second conductor pads 32) and the conductor layer 13 are each formed using any metal such as copper or nickel. In the example of FIG. 2, the conductor layer 3 includes a metal film layer (3a), which is formed of an electroless plating film or a sputtering film, and a plating film layer (3b). The conductor layer 13 also has a two-layer structure similar to that of the conductor layer 3. The via conductors 14 are integrally formed with the conductor layer 3 or the conductor layer 13. The via conductors 14 are formed of any metal such as copper or nickel similar to the conductor layers, and have the same two-layer structure as the conductor layers.

Electrodes of an electrical component (not illustrated in the drawings) mounted on the wiring substrate 1 are respectively connected to the first conductor pads 31 and the second conductor pads 32. That is, in the example of FIG. 2, the first conductor pads 31 and the second conductor pads 32 are component mounting pads of the wiring substrate 1. The conductor layer 3 and the insulating layer 2 are respectively an outermost conductor layer and an outermost insulating layer on a side of one main surface among two main surfaces of the wiring substrate 1 (surfaces orthogonal to a lamination direction of the conductor layers and the insulating layers of the wiring substrate 1). The one main surface of the wiring substrate 1 on which the conductor layer 3 and the insulating layer 2 are formed is a component mounting surface.

In the example of FIG. 2, the resin layer 4, which covers an exposed surface of the insulating layer 2 and the first conductor pads 31 and the second conductor pads 32, is a solder resist layer, which is provided for preventing a short circuit between the conductor pads and for protecting the insulating layer 2 and the conductor layer 3. The resin layer 4, which functions as a solder resist layer, is formed of, for example, an epoxy resin, a polyimide resin, or the like.

Further, in the example of FIG. 2, the first coating film 51 is a surface treatment layer (surface protective film) provided to prevent corrosion or oxidation of the surfaces (32a) of the second conductor pads 32. The first coating film 51 is, for example, a metal film having a single-layer structure or a multilayer structure formed of Au, Ni/Au, Ni/Pd/Au or the like.

In the example of FIG. 2, the protruding parts 30 provided on the first conductor pads 31 are formed to suppress a defect when an electronic component (not illustrated in the drawings) connected to the first conductor pads 31 is mounted. By providing the protruding parts 30, a short circuit may be prevented between the first conductor pads 31 and/or electrodes of an electronic component connected to the first conductor pads 31, which are adjacent to each other at small intervals. The protruding parts 30 in the example of FIG. 2 may be so-called conductive posts (metal posts), conductive pillars (metal pillars), conductive bumps (metal bumps), or the like that are provided to facilitate proper mounting of an electronic component including suppression of such a defect.

The protruding parts 30 are preferably formed of the same material as the first conductor pads 31 before the formation of the protruding parts 30. For example, when the first conductor pads 31 are formed of copper, the protruding parts 30 are preferably also formed of copper. When the first conductor pads 31 are formed of nickel, the protruding parts 30 are preferably also formed of nickel. In this way, when the protruding parts 30 are formed of the same material as the first conductor pads 31 before the formation of the protruding parts 30, the protruding parts 30 and the main body parts of the first conductor pads 31 are firmly connected to each other. That is, even when an external force is applied to the protruding parts 30, peeling or cracking at interfaces between the protruding parts 30 and the main body parts of the first conductor pads 31 is unlikely to occur. Therefore, a highly reliable connection structure can be realized between the electronic component and the wiring substrate 1.

When the first coating film 51 is formed on the main body parts of the first conductor pads 31 similar to that on the second conductor pads 32, connection strength between the main body parts of the first conductor pads 31 and the protruding parts 30 may decrease. A reason for this is that the first coating film 51 is preferably formed of a material different from that of the second conductor pads 32, that is, a material different from that the main body parts of the first conductor pads 31. As described above, in the example of FIG. 2, the first coating film 51 is provided to prevent oxidation or corrosion of the second conductor pads 32. Therefore, as the material of the first coating film 51, a material different from that of the second conductor pads 32 (first conductor pads 31) is preferably used. When such a first coating film 51 is formed on the first conductor pads 31 before the formation of the protruding parts 30, a strong connection structure formed of the same material as described above cannot be obtained for the connection between the main body parts of the first conductor pads 31 and the protruding parts 30. As a result, a desired connection strength may not be obtained between the main body parts of the first conductor pads 31 and the protruding parts 30, and a desired reliability may not be obtained.

However, in the method for manufacturing the wiring substrate of the present embodiment, as described above, the first coating film 51 formed on the second conductor pads 32 is not formed on the main body parts of the first conductor pads 31. Therefore, when the material for the protruding parts 30 and the main body parts of the first conductor pads 31, that is, the conductor layer 3 is properly selected, a structure can be obtained in which same materials are connected to each other between the protruding parts 30 and the main body parts of the first conductor pads 31. The protruding parts 30 and the main body parts of the first conductor pads 31 are thought to be firmly connected. Reliability of the wiring substrate 1 is thought to be improved.

As described above, the protruding parts 30 can be formed to suppress a defect such as a short circuit between the conductor pads formed at small intervals. When the intervals between conductor pads become narrower, the conductor pads become smaller, and thus, end surfaces of protruding parts such as conductive posts provided on the conductor pads are also thought to become smaller. That is, since an area of each of the interface between the conductor pads and the protruding parts such as conductive posts is also small, only a connection strength corresponding to the small area can be obtained between the conductor pads and the protruding parts. Therefore, a connection structure using the same material can be easily realized, and as a result, a high connection strength per unit area can be obtained. The manufacturing method of the present embodiment is thought to be particularly beneficial for manufacturing a wiring substrate that includes mounting conductor pads formed at small intervals.

In this way, in the method for manufacturing the wiring substrate of the present embodiment, it may be possible to realize a firm connection between the protruding parts 30, which can function as conductive posts or conductive pillars, and the main body parts of the first conductor pads 31. In addition, while such a firm connection is realized, the first coating film 51 formed of any material suitable for the second conductor pads 32 can be formed on the surfaces (32a) of the second conductor pads 32 where the protruding parts 30 are not formed.

In the example of FIG. 2, a second coating film 52 is formed on end surfaces (30a) (surfaces on an opposite side with respect to the insulating layer 2) of the protruding parts 30. When the second coating film 52 is formed, it may be possible to prevent a contact failure between an electronic component (not illustrated in the drawings) connected to the protruding parts 30 and the protruding parts 30. Further, it may be possible to omit supply of a bonding material (such as solder) to the protruding parts 30 or an electronic component when the electronic component is mounted. The second coating film 52 is, for example, a Sn plating film, a Ni/Sn laminated plating film, or a Ni/Pd/Au laminated plating film. These plating films may each be an electrolytic plating film or an electroless plating film. Further, the material of the first coating film 51 and the material of the second coating film 52 may be different from each other.

With reference to FIGS. 3A-3K and taking the wiring substrate 1 partially illustrated in FIG. 2 as an example, the method for manufacturing the wiring substrate of the present embodiment is further described in detail.

Figure 3A:
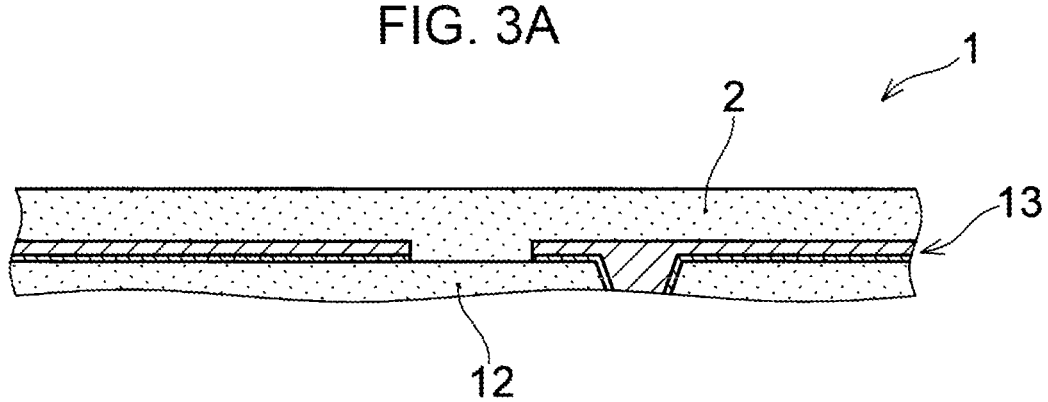
FIG. 3A is a cross-sectional view illustrating an example of a wiring substrate in a process of being manufactured using a manufacturing method according to an embodiment of the present invention.

As illustrated in FIG. 3A, the insulating layer 2 is prepared. In the example of FIG. 3A, the insulating layer 2 is prepared by laminating an insulating material on the insulating layer 12 and the conductor layer 13, which are formed in advance. The insulating layer 2, the insulating layer 12, and the conductor layer 13 may be formed, for example, using common methods for forming an insulating layer and a conductor layer in a build-up wiring substrate. For example, in the formation of the insulating layer 2, a film-like or sheet-like epoxy resin is laminated on the insulating layer 12 and the conductor layer 13. The laminated epoxy resin is heated and pressed, and as a result, the insulating layer 2 formed of the cured epoxy resin is formed. The material of the insulating layer 2 is not limited to the epoxy resin, and as described above, any insulating resin such as a BT resin or a phenol resin can be used as the material of the insulating layer 2.

The insulating layer 2 does not have to be prepared on the insulating layer and the conductor layer that are formed in advance. For example, an insulating layer sandwiched between two copper foils in a double-sided copper-clad laminated plate may be used as the insulating layer 2. Further, the insulating layer 2 may be prepared by providing a film body formed of an insulating material on a support plate to be removed in a later process.

Figure 3B:
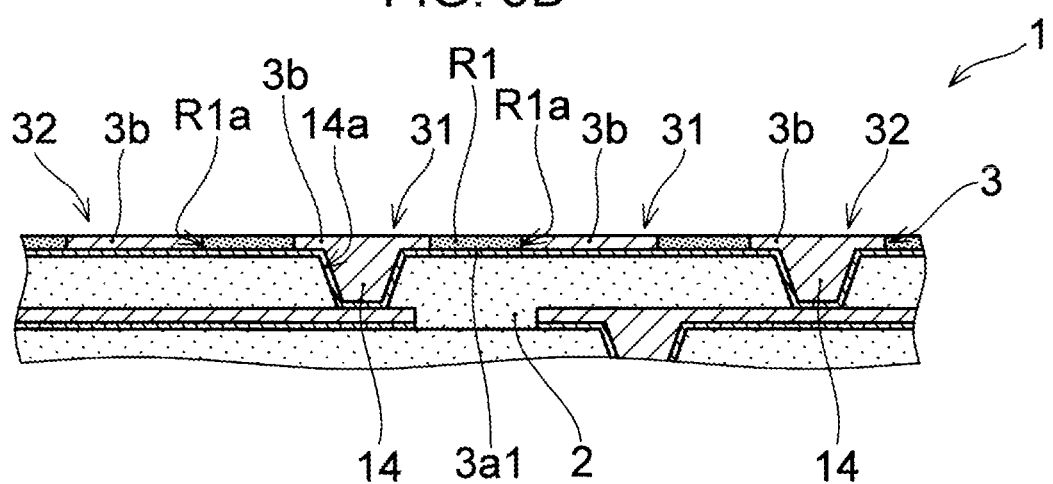
FIG. 3B is a cross-sectional view illustrating an example of a wiring substrate in a process of being manufactured using the manufacturing method according to the embodiment.

As illustrated in FIG. 3B, the conductor layer 3, which includes the multiple conductor pads (the first conductor pads 31 and the second conductor pads 32), and the via conductors 14 are formed on the insulating layer 2. In the example of FIG. 3B, the conductor layer 3 and the via conductors 14 are formed using a semi-additive method. That is, through holes (14a) penetrating the insulating layer 2 are formed at formation sites of the via conductors 14 in the insulating layer 2 by irradiating laser such as $CO_2$ laser. After that, a metal film (3a1) is formed in the through holes (14a) and on the surface of insulating layer 2, for example, by electroless plating or sputtering.

A plating resist (R1) having openings (R1a) at positions where the first conductor pads 31 and the second conductor pads 32 are formed is provided on the metal film (3a1). For example, the plating resist (R1) contains a photosensitive resin and the openings (R1a) are provided using a photolithography technology (a plating resist (R2) and openings (R2a) to be described later are also provided using the same material and method). Then, the plating film layer (3b) is formed in the openings (R1a) by electrolytic plating using the metal film (3a1) as a power feeding layer. As a result, the conductor layer 3 including the metal film (3a1) and the plating film layer (3b) is formed. In the openings (R1a), the first conductor pads 31 or the second conductor pads 32 are formed together with the via conductors 14. After that, the plating resist (R1) is removed, for example, using an alkaline peeling agent such as sodium hydroxide. Since the metal film (3a1) has not yet been removed and remains on the insulating layer 2, all the first conductor pads 31 and the second conductor pads 32 are electrically connected via the metal film (3a1).

Figure 3C:
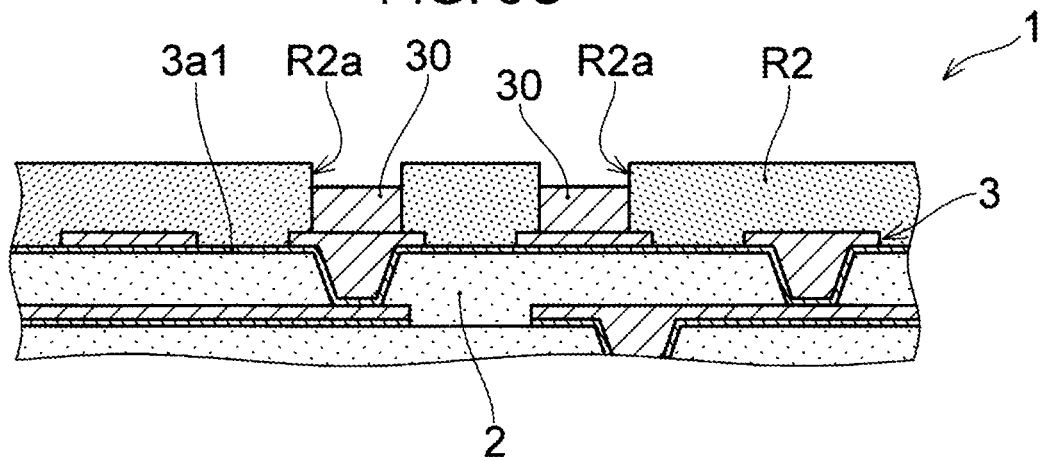
FIG. 3C is a cross-sectional view illustrating an example of a wiring substrate in a process of being manufactured using the manufacturing method according to the embodiment.

As illustrated in FIG. 3C, the protruding parts 30 are formed on the first conductor pads 31. First, as illustrated in FIG. 3C, the plating resist (R2) having the openings (R2a) at formation sites of the protruding parts 30 is formed on the conductor layer 3 and the insulating layer 2. Then, in the opening (R2a), the protruding parts 30 are formed, for example, by electrolytic plating.

When the protruding parts 30 are formed by electrolytic plating, the metal film (3a1) is preferably used as a power feeding layer. As described above, the metal film (3a1) is used as a power feeding layer in the electrolytic plating by which the multiple conductor pads including the first conductor pads 31 are formed. In the method for manufacturing the wiring substrate of the present embodiment, in this way, the power feeding layer used in the formation of the conductor pads (the first conductor pads 31), on the surfaces of which the protruding parts 30 are formed, can also be used in the formation of the protruding parts 30. Therefore, according to the present embodiment, as compared to a method in which the protruding parts 30 that function as conductive posts are formed after the power feeding layer for the formation of the conductor pads is removed, it may be possible to shorten a manufacturing process or to reduce a manufacturing cost.

The protruding parts 30 are formed to have a height of, for example, 30 μm or more and 75 μm or less relative to the surfaces of the first conductor pads 31. When the protruding parts 30 have such a height, as described above, the protruding parts 30 may be able to contribute to proper connection of an electronic component (not illustrated in the drawings) mounted on the wiring substrate 1. The protruding parts 30 can be formed to each have any planar shape (a shape viewed along the lamination direction of the insulating layer 2 and the conductor layer 3) in addition to a circular shape. The end surfaces (30a) of the protruding parts 30 do not have to be flat surfaces as in the example of FIG. 3C, but may be curved surfaces that curve upward or downward.

Figure 3D:
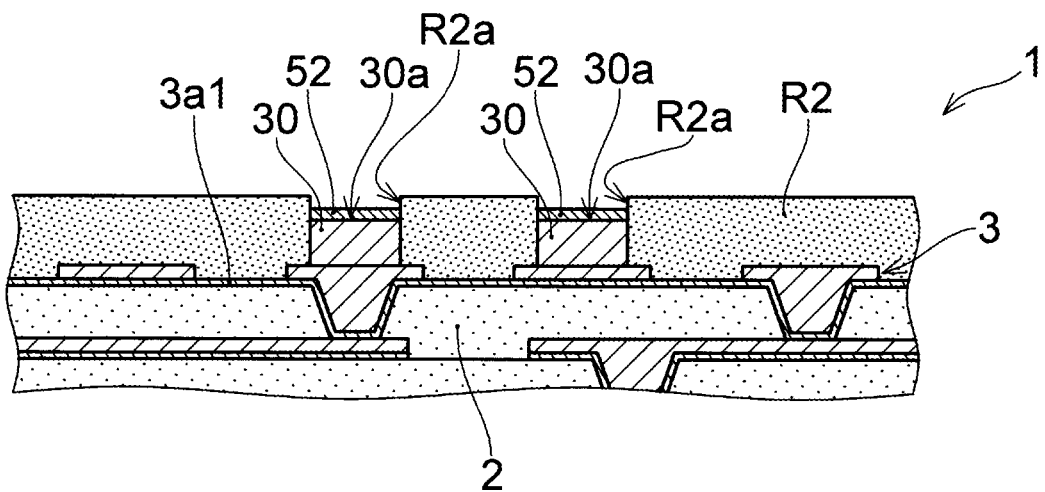
FIG. 3D is a cross-sectional view illustrating an example of a wiring substrate in a process of being manufactured using the manufacturing method according to the embodiment.

As illustrated in FIG. 3D, the second coating film 52 is formed on the end surfaces (30a) of the protruding parts 30. In this way, the method for manufacturing the wiring substrate of the present embodiment may include forming the second coating film 52 on the surfaces (end surfaces (30a)) of the protruding parts 30. For example, a Sn plating film, a Ni/Sn laminated plating film, or a Ni/Pd/Au laminated plating film is formed as the second coating film 52.

The second coating film 52 is formed, for example, by electrolytic plating. Since the conductor layer 3 and the insulating layer 2 are covered by the plating resist (R2), the second coating film 52 is formed only on the end surfaces (30a) of the protruding parts 30 exposed in the openings (R2a). By using electrolytic plating, the second coating film 52 can be formed in a relatively short time. The second coating film 52 is formed to have a thickness of, for example, about 3 μm-20 μm.

When the second coating film 52 is formed by electrolytic plating, the metal film (3a1) is preferably used as a power feeding layer. As described above, the metal film (3a1) is used in the electrolytic plating by which the multiple conductor pads including the first conductor pads 31 are formed. In the method for manufacturing the wiring substrate of the present embodiment, in this way, the power feeding layer used in the formation of the first conductor pads 31 and the like can also be used in the formation of the second coating film 52 on the protruding parts 30. Therefore, according to the present embodiment, as compared to a conventional manufacturing method, it may be possible to shorten a manufacturing process or to reduce a manufacturing cost.

After the formation of the second coating film 52, the plating resist (R2) is removed, for example, using an alkaline peeling agent such as sodium hydroxide.

Figure 3E:
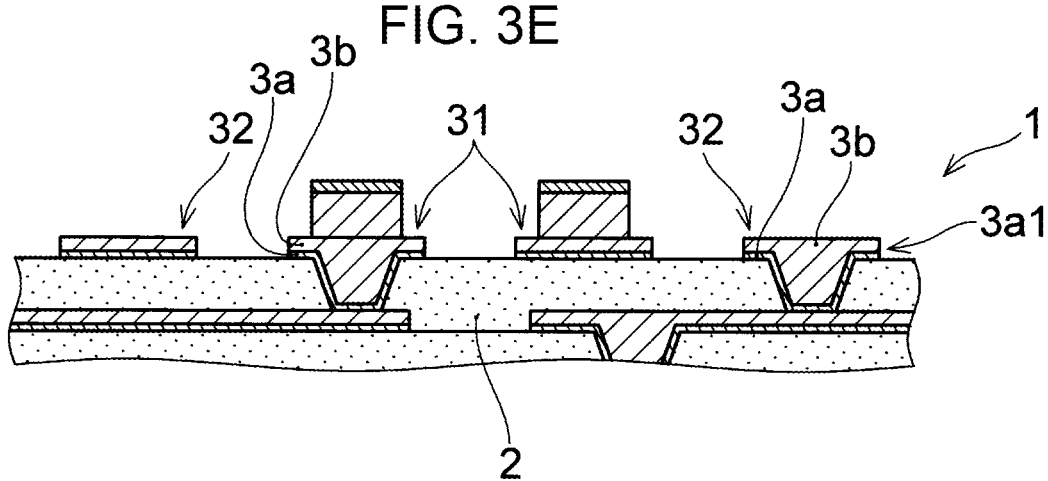
FIG. 3E is a cross-sectional view illustrating an example of a wiring substrate in a process of being manufactured using the manufacturing method according to the embodiment.

As illustrated in FIG. 3E, a portion of the metal film (3a1) that is not covered by the plating film layer (3b) is removed, for example, by quick etching or flash etching. The conductor pads (including the first conductor pads 31 and the second conductor pads 32) are all physically and electrically separated from each other. The metal film layer (3a) remains between the plating film layer (3b) and the insulating layer 2. The first conductor pads 31 and second conductor pads 32 in a final state formed of the metal film layer (3a) and the plating film layer (3b) are obtained.

In the present embodiment, in this way, by the formation of the metal film (3a1), formation of a conductor film that can be used as a power feeding layer in the formation of the conductor layer 3, the protruding parts 30, and the second coating film 52 can be performed at once. Similarly, by removing a portion of the metal film (3a1), removal of an unwanted portion of the conductor film that can be used as a power feeding layer in the formation of the conductor layer 3, the protruding parts 30, and the second coating film 52 can be performed at once. The power feeding layer (metal film (3a1)) used in the formation of the conductor layer 3, the protruding parts 30, and the second coating film 52 by electrolytic plating is formed prior to the formation of the resin layer 4 (see FIG. 3F) described below. And, the formation of the second coating film 52 is also performed before the formation of the resin layer 4. In addition, the removal of the portion of the metal film (3a1) that is not needed when the wiring substrate 1 is completed is also performed before the formation of the resin layer 4. That is, after the formation of the resin layer 4, there is no need to form or remove the power feeding layer used in the electrolytic plating by which the structural elements are formed. It is thought that the wiring substrate 1 can be efficiently manufactured.

Figure 3F:
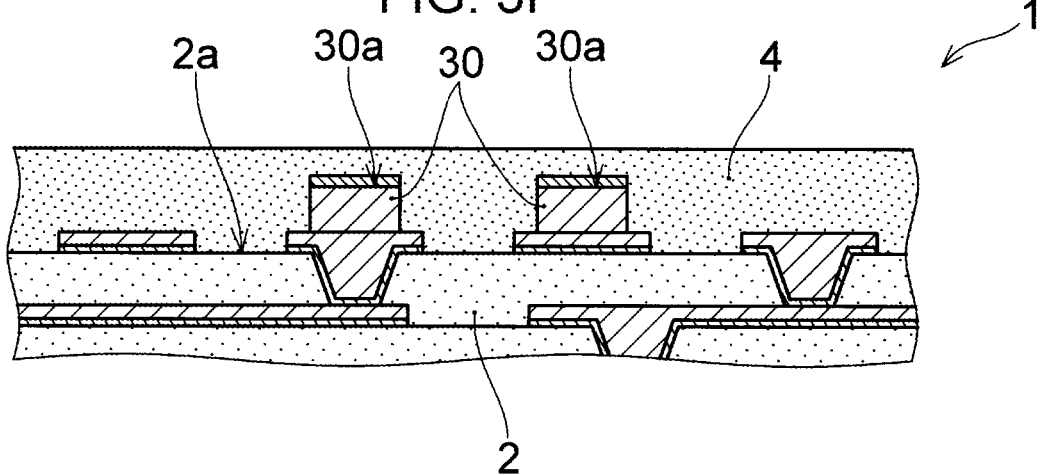
FIG. 3F is a cross-sectional view illustrating an example of a wiring substrate in a process of being manufactured using the manufacturing method according to the embodiment.

As illustrated in FIG. 3F, the resin layer 4 that covers exposed portions of the insulating layer 2 and the multiple conductor pads (the first conductor pads 31 and the second conductor pads 32) is formed. In the example of FIG. 3F, the forming of the resin layer 4 includes covering the protruding parts 30 with the resin layer 4, and the resin layer 4 is also formed on the end surfaces (30a) of the protruding parts 30. The second coating film 52 is also covered by resin layer 4. That is, the resin layer 4 is formed so as to cover all structural elements, including the incorporated parts 30, on a surface (2a) (surface on the conductor layer 3 side) of the insulating layer 2.

The resin layer 4 is formed, for example, by supplying a liquid or sheet-like epoxy resin or polyimide resin, or the like onto the surface (2a) of the insulating layer 2 and the structural elements on the surface (2a) using a method such as printing, coating, spraying, or laminating. The resin layer 4 may also be formed by injection molding using an appropriate molding mold. Further, the resin layer 4 may be formed of a photosensitive epoxy resin or polyimide resin according to a method for forming the openings (4a) (see FIG. 3I) to be described later. At the stage illustrated in FIG. 3F, the resin layer 4 is formed to have a height of, for example, 40 µm or more and 85 µm or less relative to the surface (2a) of the insulating layer 2. The resin layer 4 is fully cured or temporarily cured by heating or UV irradiation or the like when necessary.

Figure 3G:
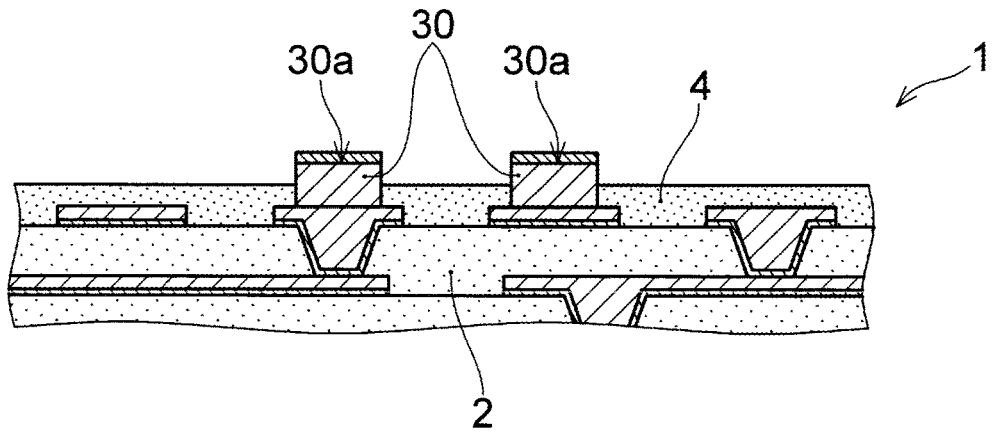
FIG. 3G is a cross-sectional view illustrating an example of a wiring substrate in a process of being manufactured using the manufacturing method according to the embodiment.

As illustrated in FIG. 3G, a portion of the resin layer 4 in a thickness direction is removed such that the end parts of the protruding parts 30 on an opposite side with respect to the insulating layer 2 are exposed from the resin layer 4. That is, the resin layer 4 is thinned and a thickness of the resin layer 4 is reduced. Specifically, a portion of the resin layer 4 having a predetermined thickness is completely removed from the surface of the resin layer 4 on an opposite side with respect to the insulating layer 2. As illustrated in FIG. 3G, the exposing of the end parts of the protruding parts 30 on an opposite side with respect to the insulating layer 2 from the resin layer 4 can include reducing the thickness of the resin layer 4. That is, by reducing the thickness of the resin layer 4, the end parts of the protruding parts 30 on an opposite side with respect to the insulating layer 2 are exposed from the resin layer 4. As illustrated in FIG. 3G, the end parts of the protruding parts 30 exposed from the resin layer 4 due to the reduction in the thickness of the resin layer 4 include the end surfaces (30a) of the protruding parts 30. The second coating film 52 is also exposed from the resin layer 4. As in the example of FIG. 3G, a portion of the resin layer 4 in the thickness direction may be removed such that the end parts of the protruding parts 30 including the end surfaces (30a) protrude from the resin layer 4.

The removal of the portion of the resin layer 4 illustrated in FIG. 4G is perform using any method. For example, the portion of the resin layer 4 is removed by dry etching such as plasma etching using a carbon tetrafluoride ($CF_4$) gas. Further, the portion of the resin layer 4 may be removed by a blast treatment using various projection materials. The resin layer 4 is thinned to a thickness of, for example, 20 µm or more and 65 µm or less. By thinning the resin layer 4 to such a thickness, it is thought that the end parts of the protruding parts 30 can be substantially reliably exposed without damaging the insulating layer 2 and the conductor layer 3.

In the wiring substrate 1, as described above, the resin layer 4 is provided as a solder resist layer that contributes to the protection of the outermost conductor layer and the outermost insulating layer (the conductor layer 3 and the insulating layer 2) of the wiring substrate 1 and to the prevention of a short circuit between the conductor pads. In the example illustrated in FIGS. 3A-3G, the resin layer 4, which can function as a solder resist layer, is formed after the protruding parts 30, which can function as conductive posts used for connecting an electronic component mounted on the wiring substrate 1, is formed. Therefore, there is no need to form, in the resin layer 4, openings (the above-described opening parts of Patent Document 1) or the like exposing the first conductor pads 31 in order to form the protruding parts 30. Therefore, it may be possible to shorten a manufacturing lead time of a wiring substrate having conductive posts for connecting to an electronic component.

Figure 3H:
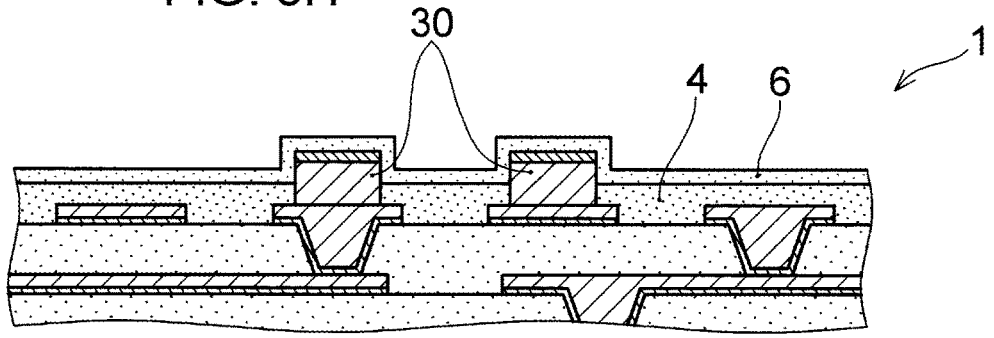
FIG. 3H is a cross-sectional view illustrating an example of a wiring substrate in a process of being manufactured using the manufacturing method according to the embodiment.

As illustrated in FIG. 3H, a protective covering 6 is provided on the resin layer 4 and the protruding parts 30 exposed from the resin layer 4. The protruding parts 30 and the resin layer 4 are covered by the protective covering 6. As in the example of FIG. 3H, the method for manufacturing the wiring substrate of the present embodiment includes covering the protruding parts 30 and the resin layer 4 with the protective covering 6. The protective covering 6 is provided, for example, by laminating a film formed of polyethylene terephthalate (PET) on the resin layer 4 and the protruding parts 30. However, a method for forming the protective covering 6 is not particularly limited to a method based on laminating a PET film, and any material and method can be used for forming the protective material 6.

Due to the protective covering 6, the resin layer 4 and the protruding parts 30 are protected from a treatment or processing performed in a later process. Therefore, the protective covering 6 is provided at the latest in any process before a process that includes a treatment or processing that can affect the resin layer 4 and the protruding parts 30. For example, the protective covering 6 is provided before the formation of the first coating film to be described later. The protective covering 6 may be provided in a process before the formation of the first coating film. For example, the protective covering 6 may be provided before the formation of the openings in the resin layer 4 to be described later.

Figure 3I:
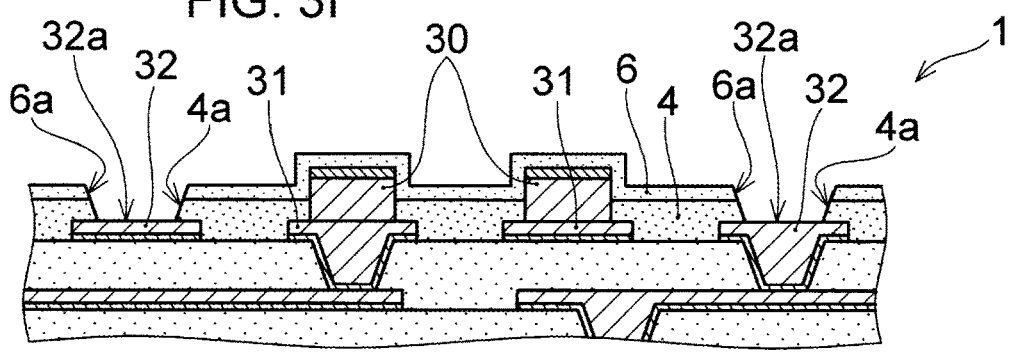
FIG. 3I is a cross-sectional view illustrating an example of a wiring substrate in a process of being manufactured using the manufacturing method according to the embodiment.

As illustrated in FIG. 3I, the openings (4a) exposing the surfaces (32a) of the second conductor pads 32 are formed in the resin layer 4. In the example illustrated in FIGS. 3G-3I, the formation of the openings (4a) is performed after the process in which the end parts of the protruding parts 30 of the first conductor pads 31 are exposed from the resin layer 4. That is, the openings (4a) are formed after the resin layer 4 is thinned. Therefore, it is thought that the openings (4a) can be easily formed in a shorter time. Further, in the example illustrated in FIG. 3I, since the protective covering 6 is provided before the formation of the openings (4a), the insulating layer 2 and the protruding parts 30 can be protected from dust and gas that may be generated during the formation of the openings (4a).

On the other hand, since the openings (4a) are formed in a state in which the resin layer 4 is covered by the protective covering 6, through holes (6a) that integrally lead to the openings (4a) are also formed in the protective covering 6. Therefore, in the method for manufacturing the wiring substrate of the present embodiment, as illustrated in FIG. 3I, the forming of the openings (4a) in the resin layer 4 may include forming, in the protective covering 6, the through holes (6a) that lead to the openings (4a).

The openings (4a) of the resin layer 4 are formed, for example, by irradiating laser to the resin layer 4. Even when the protective covering 6 is formed of a non-photosensitive material, the openings (4a) can be formed without using a photolithography technology. Examples of the laser used for forming the openings (4a) include $CO_2$ laser, YAG lase, and the like. However, the laser used for forming the openings (4a) is not limited to these. When the resin layer 4 and the protective covering 6 are formed of a photosensitive material, the openings (4a) may be formed by photolithography.

Figure 3J:
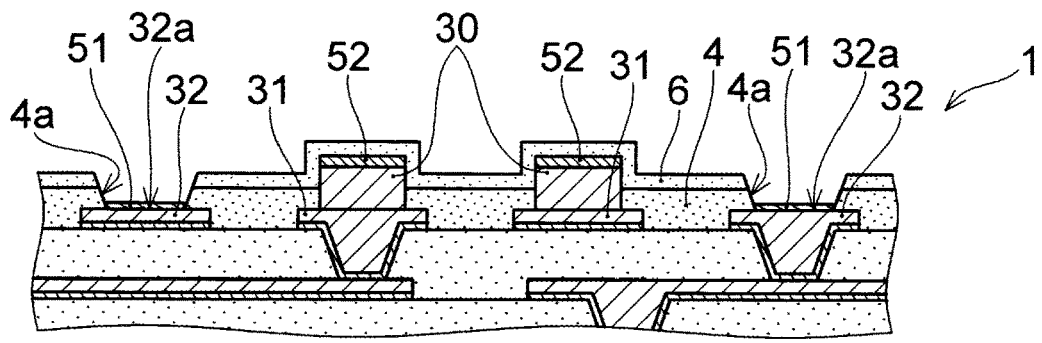
FIG. 3J is a cross-sectional view illustrating an example of a wiring substrate in a process of being manufactured using the manufacturing method according to the embodiment.

As illustrated in FIG. 3J, the first coating film 51 is formed on the surfaces (32a) of the second conductor pads 32 exposed in the openings (4a) of the resin layer 4. The first coating film 51 is formed by, for example, electroless plating. In the example of FIG. 3J, the first coating film 51 functions as a surface treatment layer (surface protective film) that prevents corrosion or oxidation of the surfaces (32a) of the second conductor pads 32. As the first coating film 51, for example, an Au plating film, a Ni/Au laminated plating film, or a Ni/Pd/Au laminated plating film can be formed.

The first coating film 51 and the second coating film 52 may be formed of different materials. It may be possible to respectively realize, for the second conductor pads 32 and for the protruding parts 30 of the first conductor pads 31, surface states that are respectively suitable for a method for mounting an electronic component (not illustrated in the drawings) on the second conductor pads 32 and a method for mounting an electronic component (not illustrated in the drawings) on the first conductor pads 31.

The first coating film 51 is formed to have a thickness of, for example, about 0.05 μm or more and 3 μm or less. The first coating film 51 may be formed to have a thickness different from that of the second coating film 52. Even when the second coating film 52 is formed by electrolytic plating and the first coating film 51 is formed by electroless plating, it is thought that the first coating film 51 can be formed in a relatively short time.

In the example illustrated in FIG. 3J, the formation of the first coating film 51 is performed in a state in which the protruding parts 30 of the first conductor pads 31 and resin layer 4 are covered by the protective covering 6. Unintended formation of a film body on the protruding parts 30 and the resin layer 4 during the formation of the first coating film 51 is prevented. After the formation of the first coating film 51, the protective covering 6 is removed using a suitable solvent.

Figure 3K:
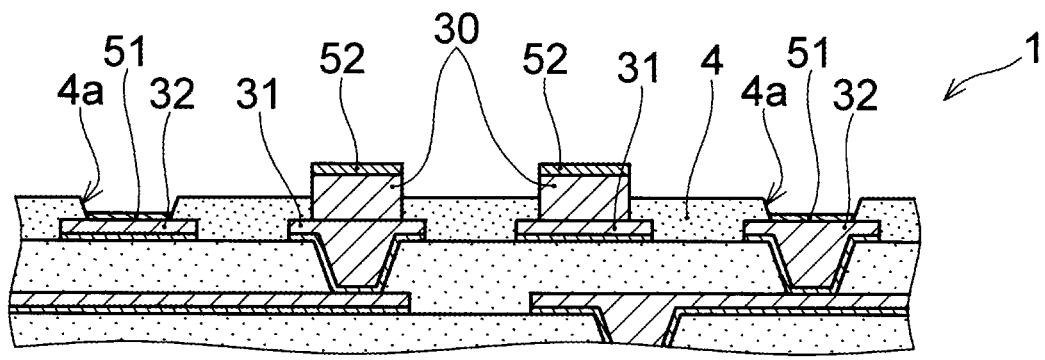
FIG. 3K is a cross-sectional view illustrating an example of a wiring substrate in a process of being manufactured using the manufacturing method according to the embodiment.

Through the above processes, as illustrated in FIG. 3K, the wiring substrate 1 is completed, which includes, on the component mounting surface, the first conductor pads 31 having the protruding parts 30, the second conductor pads 32 having the first coating film 51, and the resin layer 4.

According to the method for manufacturing the wiring substrate of the present embodiment, in the wiring substrate that includes the first conductor pads 31, which have the protruding parts 30, and the second conductor pads 32, which do not have protruding parts, the first coating film 51 suitable for the second conductor pads 32 can be provided only on the second conductor pads 32. Further, the first coating film 51 can be formed on the second conductor pads 32 without interposing a material different from the material forming the first conductor pads 31 at the interfaces between the protruding parts 30 and the main body parts of the first conductor pads 31. In addition, the second coating film 52 formed of a different material or having a different thickness from that of the first coating film 51 can be provided on the protruding parts 30 of the first conductor pads 31. It is thought that the coating films (surface treatment layers) that are respectively suitable for the first conductor pads 31 and for the second conductor pads 32 can be respectively formed on the conductor pads. In addition, according to the present embodiment, it is not necessary to form openings in the resin layer 4 for forming the protruding parts 30 of the first conductor pads 31. Therefore, it is possible to shorten a manufacturing process of the wiring substrate and to reduce a manufacturing cost of the wiring substrate.

Figure 4A:
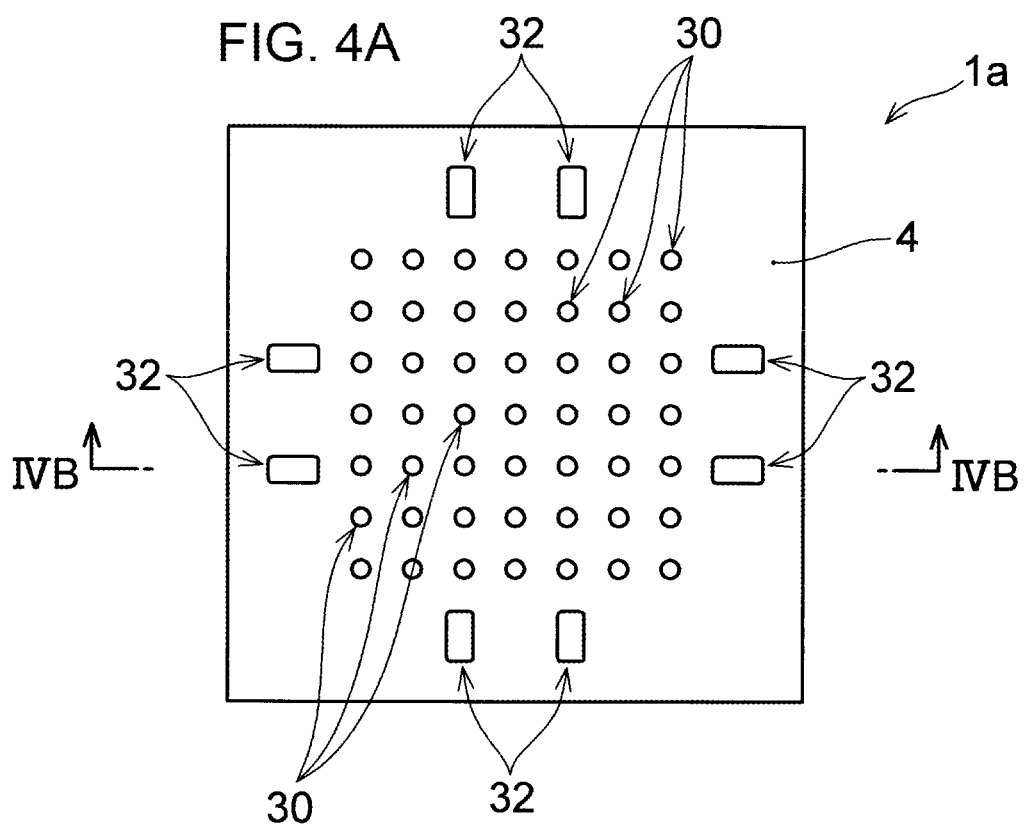
FIG. 4A is a plan view illustrating another example of a wiring substrate manufactured using a manufacturing method according to an embodiment of the present invention.
Figure 4B:
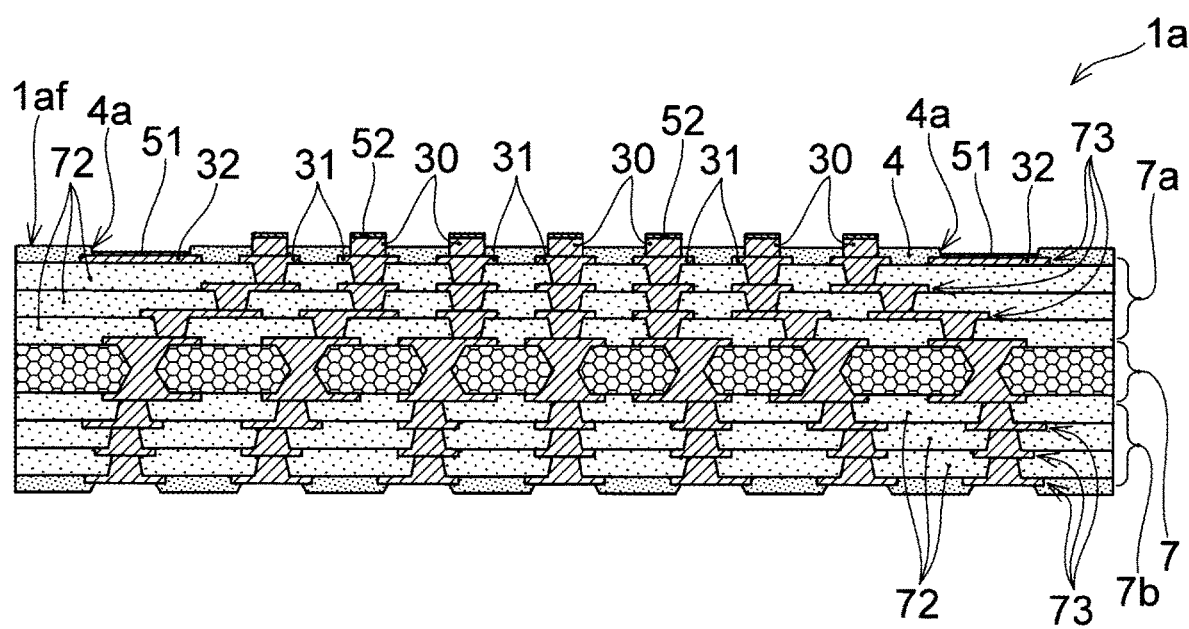
FIG. 4B is a cross-sectional view illustrating the other example of the wiring substrate manufactured using the manufacturing method according to the embodiment of the present invention.

FIGS. 4A and 4B respectively illustrate a plan view and a cross-sectional view of a wiring substrate (1a) that is an example of a wiring substrate manufactured using the method for manufacturing the wiring substrate of the present embodiment and is different from the example of FIG. 2. FIG. 4B is a cross-sectional view along an IVB-IVB line illustrated in FIG. 4A.

As illustrated in FIGS. 4A and 4B, the wiring substrate (1a) includes a core substrate 7, and a build-up layer (7a) and a build-up layer (7b) that are respectively formed on both sides of the core substrate 7. The build-up layer (7a) and the build-up layer (7b) are each formed of alternately laminated insulating layer 72 and conductor layer 73. The wiring substrate (1a) has a surface (1af) as a surface on the build-up layer (7a) side. Among the multiple insulating layers 72, the insulating layer 72 positioned outermost on the surface (1af) side corresponds to the insulating layer 2 in the example of FIG. 2, and, among the multiple conductor layers 73, the conductor layer 73 positioned outermost on the surface (1af) side corresponds to the conductor layer 3 in the example of FIG. 2. In the following description, the "insulating layer 72" means the insulating layer 72 positioned outermost on the surface (1af) side, and the "conductor layer 73" means the conductor layer 73 positioned outermost on the surface (1af) side.

The wiring substrate (1a) includes the resin layer 4, which is formed using the method for manufacturing the wiring substrate of the present embodiment, as a solder resist layer that covers the insulating layer 72 and the conductor layer 73. The conductor layer 73 includes the multiple first conductor pads 31 and the multiple second conductor pads 32, which are formed using the method for manufacturing the wiring substrate of the present embodiment. The protruding parts 30 are formed on the first conductor pads 31, and the first coating film 51 is formed on the surfaces of the second conductor pads 32 exposed to the openings (4a) of the resin layer 4. The second coating film 52 is formed on the end surfaces (30a) of the protruding parts 30 of the first conductor pads 31.

As illustrated in FIG. 4A, the protruding parts 30 are formed in a matrix shape. That is, the multiple first conductor pads 31 are formed in a matrix shape, and the second conductor pads 32 are formed around a group of the first conductor pads 31. For example, a semiconductor device of a small package form, such as a bare chip state or a chip size package (CSP), having electrodes formed at a fine pitch is connected to the multiple first conductor pads 31. On the other hand, for example, a passive component such as a chip capacitor or a chip resistor, or an individual semiconductor such as transistor, is connected to the second conductor pads 32.

Each of the first conductor pads 31 is much smaller in planar size than each of the second conductor pads 32. Therefore, the interfaces between the protruding parts 30 and the main body parts of the first conductor pads 31 can each have only a small area. Therefore, it is preferable that a material different from the material of the first conductor pads 31 is not interposed at the interfaces between the protruding parts 30 and the main body parts of the first conductor pads 31. Further, on the first conductor pads 31 and the second conductor pads 32 on which mutually different electronic components are respectively mounted, it is thought to be preferable that surface treatment layers formed of mutually different materials suitable for the electronic components or bonding materials connected to the first conductor pads 31 and the second conductor pads 32 are formed.

Therefore, the manufacturing method of the present embodiment, which allows the first conductor pads 31 having the protruding parts 30 without a dissimilar material interposed therein and the first and second coating films (51, 52) suitable for the conductor pads to be formed in a short lead time, is particularly beneficial for manufacturing the wiring substrate (1*a*) of the example of FIGS. 4A and 4B.

The method for manufacturing the wiring substrate of the embodiment is not limited the method described with reference to the drawings. For example, it is also possible that the protruding parts 30 of the first conductor pads 31 are formed by electroless plating. It is also possible that the second coating film 52 is also formed by electroless plating. Further, it is also possible that the second coating film 52 is not formed and the via conductors 14 are also not formed. In the method for manufacturing the wiring substrate of the embodiment, it is also possible that any process other than the processes described above is added, or some of the processes described above are omitted.

Further, wiring substrates manufactured using the method for manufacturing the wiring substrate of the present embodiment are not limited the wiring substrates (1, 1*a*) illustrated in FIG. 2 and FIGS. 4A and 4B. The insulating layer 2 and the conductor layer 3 do not have to be respectively the outermost insulating layer and the outermost conductor layer of the wiring substrate 1. For example, it is also possible that the protruding parts 30 having any effect are formed on the first conductor pads 31 of the conductor layer 3, which is formed as an inner-layer conductor layer, the resin layer 4 is formed as an interlayer insulating layer, and the first coating film 51 covering the second conductor pads 32 is formed, and, after that, an insulating layer and a conductor layer are further laminated. Therefore, the first and second conductor pads (31, 32) do not have to be component mounting pads. The first and second conductor pads (31, 32) may be any conductor pads, such as via pads, provided in an inner-layer conductor layer. Therefore, the protruding parts 30 of the first conductor pads 31 do not have to be conductive posts used for connecting to an electronic component. Further, the resin layer 4 does not have to be a solder resist layer, and the first coating film 51 and the second coating film 52 do not have to be surface treatment layers formed on component mounting pads with an intention of preventing corrosion or oxidation.

In the method described in Japanese Patent Application Laid-Open Publication No. 2010-129996, when there are connection pads on which metal posts are not formed, it may be difficult to form a desired surface treatment layer only on desired connection pads, not on connection pads on which the metal posts are formed. Therefore, a surface treatment layer may be interposed between the connection pads and the metal posts, and this may affect connection reliability between the connection pads and the metal posts.

A method for manufacturing a wiring substrate according to an embodiment of the present invention includes: forming multiple conductor pads on an insulating layer; forming protruding parts on surfaces of first conductor pads among the multiple conductor pads; forming a resin layer that covers exposed portions of the insulating layer and the multiple conductor pads; exposing end parts of the protruding parts on an opposite side with respect to the insulating layer from the resin layer; forming, in the resin layer, openings that expose surfaces of second conductor pads among the multiple conductor pads; and forming a first coating film on the surfaces of the second conductor pads exposed in the openings.

According to an embodiment of the present invention, in the wiring substrate, for example, it may be possible to improve reliability of connection between protruding parts and conductor pads, the protruding parts being provided on the conductor pads for connection with a mounting component.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring substrate, comprising:
   forming a plurality of conductor pads on an insulating layer such that the plurality of conductor pads includes a plurality of first conductor pads and a plurality of second conductor pads;
   forming a plurality of protruding parts on surfaces of the first conductor pads of the plurality of conductor pads, respectively;
   forming a resin layer such that the resin layer covers the insulating layer and the plurality of conductor pads;
   exposing, from the resin layer, end portions of the protruding parts on an opposite side with respect to the insulating layer;
   forming, in the resin layer, a plurality of openings such that the openings expose surfaces of the second conductor pads of the plurality of conductor pads, respectively; and
   forming a coating film on the surfaces of the second conductor pads exposed in the openings.

2. The method for manufacturing a wiring substrate according to claim 1, wherein the forming of the resin layer includes covering the protruding parts with the resin layer, and the exposing of the end portions of the protruding parts includes reducing a thickness of the resin layer.

3. The method for manufacturing a wiring substrate according to claim 1, wherein the forming of the openings is conducted after the exposing of the end portions of the protruding parts.

4. The method for manufacturing a wiring substrate according to claim 1, wherein the plurality of conductor pads are formed by electrolytic plating, and the protruding parts are formed by electrolytic plating in which a power feeding layer used in the forming of the plurality of conductor pads is used as a power feeding layer.

5. The method for manufacturing a wiring substrate according to claim 1, further comprising:
   forming a second coating film on surfaces of the protruding parts.

6. The method for manufacturing a wiring substrate according to claim 5, wherein the forming of the second coating film is conducted before the forming of the resin layer.

7. The method for manufacturing a wiring substrate according to claim 5, wherein the second coating film is formed by electrolytic plating in which a power feeding layer used in the forming of the conductor pads is used as a power feeding layer.

8. The method for manufacturing a wiring substrate according to claim 5, wherein the coating film is formed by electroless plating.

9. The method for manufacturing a wiring substrate according to claim 1, further comprising:
covering the protruding parts and the resin layer with a protective covering before the forming of the openings.

10. The method for manufacturing a wiring substrate according to claim 9, wherein the forming of the openings includes forming, in the protective covering, a plurality of through holes connected to the plurality of openings, respectively.

11. The method for manufacturing a wiring substrate according to claim 9, wherein the forming of the coating film is conducted in a state in which the resin layer is covered by the protective covering.

12. The method for manufacturing a wiring substrate according to claim 1, wherein the plurality of openings are formed by irradiating laser.

13. The method for manufacturing a wiring substrate according to claim 2, wherein the forming of the openings is conducted after the exposing of the end portions of the protruding parts.

14. The method for manufacturing a wiring substrate according to claim 2, wherein the plurality of conductor pads are formed by electrolytic plating, and the protruding parts are formed by electrolytic plating in which a power feeding layer used in the forming of the plurality of conductor pads is used as a power feeding layer.

15. The method for manufacturing a wiring substrate according to claim 2, further comprising:
forming a second coating film on surfaces of the protruding parts.

16. The method for manufacturing a wiring substrate according to claim 15, wherein the forming of the second coating film is conducted before the forming of the resin layer.

17. The method for manufacturing a wiring substrate according to claim 15, wherein the second coating film is formed by electrolytic plating in which a power feeding layer used in the forming of the conductor pads is used as a power feeding layer.

18. The method for manufacturing a wiring substrate according to claim 15, wherein the coating film is formed by electroless plating.

19. The method for manufacturing a wiring substrate according to claim 2, further comprising:
covering the protruding parts and the resin layer with a protective covering before the forming of the openings.

20. The method for manufacturing a wiring substrate according to claim 19, wherein the forming of the openings includes forming, in the protective covering, a plurality of through holes connected to the plurality of openings, respectively.

* * * * *